United States Patent
Haworth et al.

(10) Patent No.: US 7,847,552 B2
(45) Date of Patent: Dec. 7, 2010

(54) EXCLUSION OF COMPROMISED PET DATA DURING SIMULTANEOUS PET-MR ACQUISITION

(75) Inventors: Robert H. Haworth, Brookfield, WI (US); Steven G. Ross, Waukesha, WI (US); Charles W. Stearns, New Berlin, WI (US); Jason A. Polzin, Lake Mills, WI (US); Alexander Ganin, Whitefish Bay, WI (US)

(73) Assignee: General Electric Company, Schenectady, NY (US)

( * ) Notice: Subject to any disclaimer, the term of this patent is extended or adjusted under 35 U.S.C. 154(b) by 968 days.

(21) Appl. No.: 11/621,622

(22) Filed: Jan. 10, 2007

(65) Prior Publication Data

US 2008/0164875 A1   Jul. 10, 2008

(51) Int. Cl.
*G01V 3/00* (2006.01)
(52) U.S. Cl. ...................................... 324/318; 324/322
(58) Field of Classification Search ................. 324/318, 324/322

See application file for complete search history.

(56) References Cited

U.S. PATENT DOCUMENTS

| | | | |
|---|---|---|---|
| 4,939,464 A | 7/1990 | Hammer | |
| 6,501,978 B2 * | 12/2002 | Wagshul et al. | 600/411 |
| 6,700,373 B2 | 3/2004 | Mueller et al. | |
| 6,927,406 B2 | 8/2005 | Zyromski | |
| 6,946,841 B2 | 9/2005 | Rubashov | |
| 7,286,867 B2 * | 10/2007 | Schlyer et al. | 600/407 |
| 7,286,871 B2 * | 10/2007 | Cohen | 600/544 |
| 7,595,640 B2 * | 9/2009 | Ladebeck et al. | 324/318 |
| 2004/0057609 A1 | 3/2004 | Weinberg | |
| 2005/0082486 A1 | 4/2005 | Schlyer et al. | |
| 2005/0113667 A1 | 5/2005 | Schlyer et al. | |
| 2006/0052685 A1 | 3/2006 | Cho et al. | |
| 2006/0250133 A1 | 11/2006 | Krieg et al. | |
| 2006/0251312 A1 | 11/2006 | Krieg et al. | |
| 2007/0102641 A1 | 5/2007 | Schmand et al. | |

FOREIGN PATENT DOCUMENTS

WO   02071922 A2   9/2002

OTHER PUBLICATIONS

Shao, et al., Simultaneous PET and MR Imaging, Phys. Med. Biol. 42 (1997) 1965-1970.
Benoit Pirotte, MD, et al., "Integrated positron emission tomography and magnetic resonance imaging-guided resection of brain tumors: a report of 103 consecutive procedures", J Neurosurg, 104: 238-253, 2006.
Pichler, PhD; et al., Performance Test of an LSO-APD Detector in a 7-T MRI Scanner for Simultaneous PET/MRI, The Journal of Nuclear Medicine, vol. 47, No. 4, Apr. 2006.

(Continued)

*Primary Examiner*—Louis M Arana
(74) *Attorney, Agent, or Firm*—Ziolkowski Patent Solutions Group, SC

(57) ABSTRACT

A system and method for simultaneously acquiring PET and MR data from a subject of interest with a hybrid PET-MR scanner includes monitoring transmission times of RF and gradient coils of the MR equipment and blanking segments of the PET data stream accordingly. By excluding PET data acquired during active MR transmissions, the remaining PET data used for image reconstruction will provide improved PET image quality.

24 Claims, 4 Drawing Sheets

OTHER PUBLICATIONS

Frahani, PhD; et al., Contemporaneous Positron Emission Tomography and MR Imaging at 1.5 T, Journal of Magnetic Resonance Imaging 9:497-500 (1999).

Slates, et al., A Study of Artefacts in Simultaneous PET and MR Imaging Using a Prototype MR Compatible PET Scanner, Phys. Med. Biol. 44 (1999) 2015-2027.

Marsden, et al., Simultaneous PET and NMR, The British Journal of Radiology 75 (2002), S53-S59.

Peng, et al., Placing a PET Insert in the Bore of a 7T Magnet: Initial Study of the Interactions of the MRI System with the PET Shielding, Proc. Intl. Soc. Mag. Reson. Med. 14 (2006), 1358.

Markus Schwaiger, MD, et al., "MR-PET: Combining Function, Anatomy, and More", Special Molecular Imaging, Sep. 25-30, 2005.

Jamali, et al., Magnetic Field Inhomogeneities Induced by PET Detector Scintillators in Dual Modality MRI/PET Systems, Proc. Intl. Soc. Mag. Reson. Med. 14 (2006), 1360.

Gilbert, et al., Magnet Design and Construction for a Field-Cycled MRI/PET System, Proc. Intl. Soc. Mag. Reson. Med. 14 (2006), 1357.

Garlick, et al., PET and NMR Dual Acquisition (PANDA): Applications to Isolated, Perfused Rat Hearts, NMR in Biomedicine, vol. 10 (1997), 138-142.

Peng, et al., Evaluation of Mesh Photomultiplier Tube Operation for Dual Modality PET/MRI Systems, Proc. Intl. Soc. Mag. Reson. Med. 14 (2006), 1359.

Handler, et al., Constraints Imposed on MRI in a Mixed Modality PET/MRI System, Proc. Intl. Soc. Mag. Reson. Med. 14 (2006), 1361.

Garlick, Simultaneous PET and NMR—Initial Results from Isolated Perfused Rat Hearts, The British Journal of Radiology, 75 (2002), S60-S66.

* cited by examiner

EXCLUSION OF COMPROMISED PET DATA DURING SIMULTANEOUS PET-MR ACQUISITION

BACKGROUND OF THE INVENTION

The present invention relates generally to positron emission tomography (PET) and magnetic resonance (MR) imaging, and more specifically, to a combined PET-MR system and method for excluding PET data detected during MR transmissions to improve overall data quality of a PET scan.

PET imaging involves the creation of tomographic images of positron emitting radionuclides in a subject of interest. A radionuclide-labeled agent is administered to a subject positioned within a detector ring. As the radionuclides decay, positively charged photons known as "positrons" are emitted therefrom. As these positrons travel through the tissues of the subject, they lose kinetic energy and ultimately collide with an electron, resulting in mutual annihilation. The positron annihilation results in a pair of oppositely-directed gamma rays being emitted at approximately 511 keV.

It is these gamma rays that are detected by the scintillators of the detector ring. When struck by a gamma ray, each scintillator illuminates, activating a photovoltaic component, such as a photodiode. The signals from the photovoltaics are processed as incidences of gamma rays. When two gamma rays strike oppositely positioned scintillators at approximately the same time, a coincidence is registered. Data sorting units process the coincidences to determine which are true coincidence events and sort out data representing deadtimes and single gamma ray detections. The coincidence events are binned and integrated to form frames of PET data which may be reconstructed into images depicting the distribution of the radionuclide-labeled agent and/or metabolites thereof in the subject.

MR imaging involves the use of magnetic fields and excitation pulses to detect the free induction decay of nuclei having net spins. When a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

These magnetic fields and RF pulses of MR imaging can affect the function of PET components, and consequently, the reliability of acquired PET data. In hybrid systems which combine these two modalities, the magnetic fields and RF pulses of the MR components can affect the PET detector ring components to varying degrees. For example, photomultiplier tubes and other photovoltaics do not function very well in magnetic fields. Similarly, RF pulses can cause increased noise in the PET detection signals. Thus, PET data acquired at the time of an RF or gradient pulse might be considered suspect and, in some instances, may be unusable for PET reconstruction.

Some attempts at compensating for the effects of MR transmissions on PET data have included the use of RF shielding on and about the PET components. However, these techniques may not always be completely effective at eliminating the effects of MR transmissions on PET components and detected data quality, especially in higher tesla MR imaging. In addition, the inclusion of RF shielding increases the cost and complexity of hybrid MR-PET systems. Other attempts at compensating for MR interference with PET acquisition have included the use of light pipes to convey scintillator illuminations to remotely located and shielded photovoltaics. Such methods also increase the cost and complexity, as well as the size, of MR-PET scanners.

It would therefore be desirable to have a system and method capable of efficiently and effectively compensating for the effects of MR gradient and RF pulse transmissions on PET equipment without the need for complex RF shielding or other additional physical compensation components. It would be further desirable if the system could adapt to perform such compensation in various configurations of existing hybrid PET-MR scanning systems.

BRIEF DESCRIPTION OF THE INVENTION

A system and method are provided for improving PET data quality in the presence of simultaneous MR data acquisitions. By excluding PET data acquired during active MR transmissions, the aforementioned drawbacks of existing compensation systems can be avoided.

Therefore, in accordance with one aspect of the invention, an imaging scanner includes a number of gradient coils positioned about the bore of a magnet to impress a polarizing field therein, an RF coil assembly that emits RF pulse sequences and receives resulting MR signals from a subject of interest in the bore, a detector positioned to detect PET emissions from the subject of interest, and a coincidence processor connected to receive an output from the detector. A blanking control is also included to identify periods during which PET detection may be compromised.

In accordance with another aspect of the invention, an image acquisition controller is disclosed which includes an MR transmission monitor that outputs signals indicative of MR transmissions to a processing unit. The processing unit is programmed to receive these signals and generate a timing sequence of MR transmission times based on the signals. Using the timing sequence, the processing unit can exclude data from a PET imaging process.

In accordance with a further aspect of the invention, a method for PET imaging is disclosed. The method includes administering a PET agent to a subject, detecting positron emissions from the subject to generate a stream of PET data, and then excluding MR-compromised PET data from the stream of PET data. PET images may then be reconstructed from the remaining data of the stream of PET data.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION OF THE INVENTION

Figure 1:
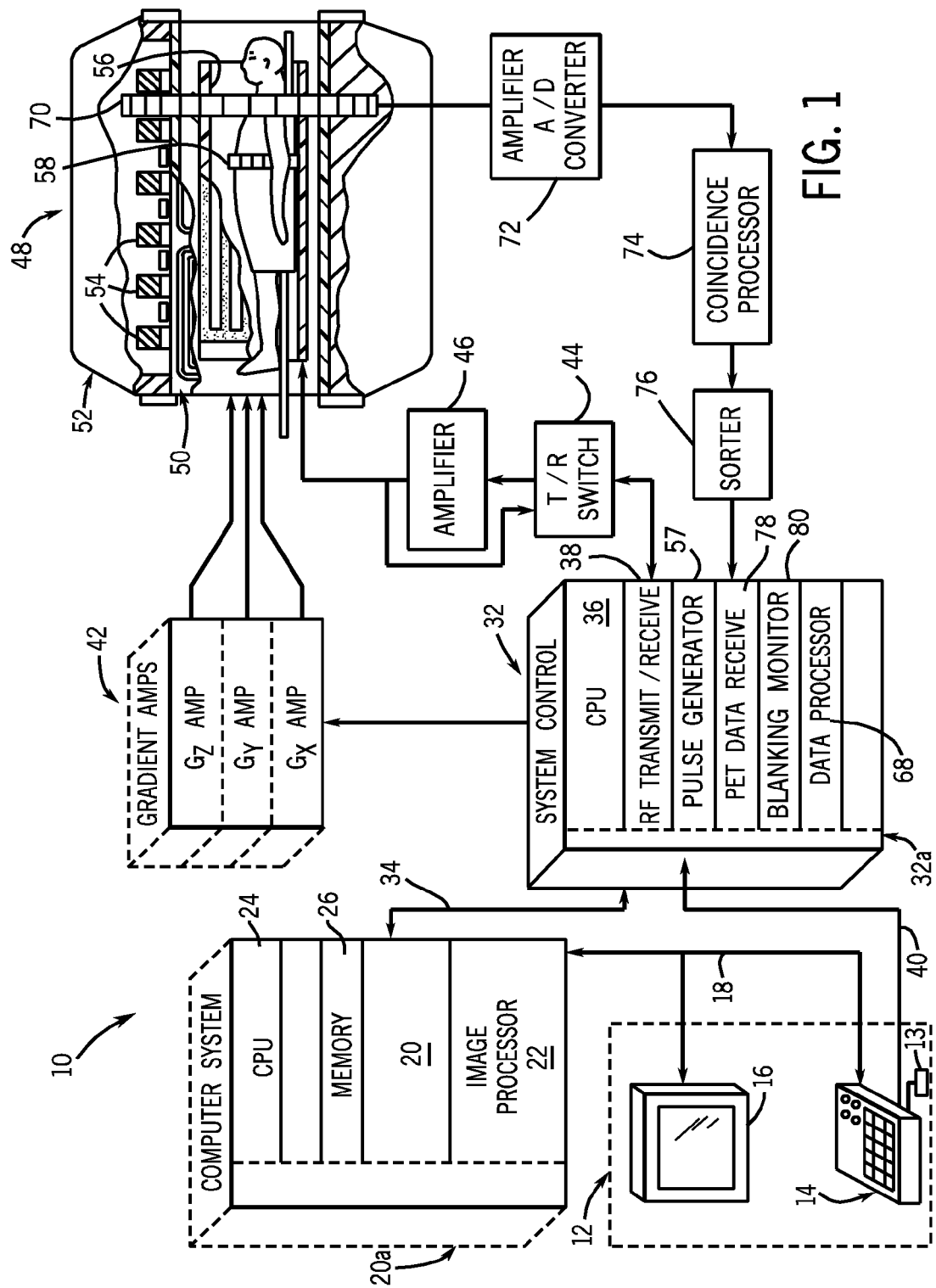
FIG. 1 is a schematic block diagram of a hybrid PET-MR imaging system incorporating an embodiment of the present invention.

Referring to FIG. 1, the major components of an exemplary hybrid PET-MR imaging system 10 that may incorporate embodiments of the present invention are shown. The operation of the system may be controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules, such as an image processor module 22, a CPU module 24 and a memory module 26. The computer system 20 may also be connected to permanent or back-up memory storage, a network, or may communicate with a separate system control 32 through link 34. The input device 13 can include a mouse, keyboard, track ball, touch activated screen, light wand, or any similar or equivalent input device, and may be used for interactive geometry prescription.

The system control 32 includes a set of modules in communication with one another and connected to the operator console 12 through link 40. It is through link 34 that the system control 32 receives commands to indicate the scan sequence or sequences that are to be performed. For MR data acquisition, an RF transmit/receive module 38 commands the scanner 48 to carry out the desired scan sequence, by sending instructions, commands, and/or requests describing the timing, strength and shape of the RF pulses and pulse sequences to be produced, to correspond to the timing and length of the data acquisition window. In this regard, a transmit/receive switch 44 controls the flow of data via amplifier 46 to scanner 48 from RF transmit module 38 and from scanner 48 to RF receive module 38. The system control 32 also connects to a set of gradient amplifiers 42, to indicate the timing and shape of the gradient pulses that are produced during the scan.

The gradient waveform instructions produced by system control 32 are sent to the gradient amplifier system 42 having Gx, Gy, and Gz amplifiers. Amplifiers 42 may be external of scanner 48 or system control 32, or may be integrated therein. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and an RF coil assembly 56, 58. Alternatively, the gradient coils of gradient coil assembly 50 may be independent of the magnet assembly 52. RF coil assembly may include a whole-body RF transmit coil 56 as shown, surface or parallel imaging coils 58, or a combination of both. The coils 56, 58 of the RF coil assembly may be configured for both transmitting and receiving, or for transmit-only or receive-only. A pulse generator 57 may be integrated into system control 32 as shown, or may be integrated into scanner equipment 48, to produce pulse sequences or pulse sequence signals for the gradient amplifiers 42 and/or the RF coil assembly 56, 58. In addition, pulse generator 57 may generate PET data blanking signals synchronously with the production of the pulse sequences. These blanking signals may be generated on separate logic lines for subsequent data processing. The MR signals resulting from the excitation pulses, emitted by the excited nuclei in the patient, may be sensed by the whole body coil 56 or by separate receive coils, such as parallel coils or surface coils 58, and are then transmitted to the RF transmit/receive module 38 via T/R switch 44. The MR signals are demodulated, filtered, and digitized in the data processing section 68 of the system control 32.

An MR scan is complete when one or more sets of raw k-space data has been acquired in the data processor 68. This raw k-space data is reconstructed in data processor 68 which operates to transform the data (through Fourier or other techniques) into image data. This image data is conveyed through link 34 to the computer system 20 where it is stored in memory 26. Alternatively, in some systems computer system 20 may assume the image data reconstruction and other functions of data processor 68. In response to commands received from the operator console 12, the image data stored in memory 26 may be archived in long term storage or may be further processed by the image processor 22 or CPU 24 and conveyed to the operator console 12 and presented on the display 16.

In combined MR-PET scanning systems, PET data may be acquired simultaneously with the MR data acquisition described above. Thus, scanner 48 also contains a positron emission detector 70, configured to detect gamma rays from positron annihilations emitted from a subject. Detector 70 preferably includes a plurality of scintillators and photovoltaics arranged about a gantry. Detector 70 may, however, be of any suitable construction for acquiring PET data. In addition, the scintillator packs, photovoltaics, and other electronics of the detector 70 need not be shielded from the magnetic fields and/or RF fields applied by the MR components 54, 56. However, it is contemplated that embodiments of the present invention may include such shielding as known in the art, or may be combined with various other shielding techniques.

Gamma ray incidences detected by detector 70 are transformed, by the photovoltaics of the detector 70, into electrical signals and are conditioned by a series of front-end electronics 72. These conditioning circuits 72 may include various amplifiers, filters, and analog-to-digital converters. The digital signals output by front end electronics 72 are then processed by a coincidence processor 74 to match gamma ray detections as potential coincidence events. When two gamma rays strike detectors approximately opposite one another, it is possible, absent the interactions of random noise and signal gamma ray detections, that a positron annihilation took place somewhere along the line between the detectors. Thus, the coincidences determined by coincidence processor 74 are sorted into true coincidence events and are ultimately integrated by data sorter 76. The coincidence event data, or PET data, from sorter 76 is received by the system control 32 at a PET data receive port 78 and stored in memory 66 for subsequent processing 68. PET images may then be reconstructed by image processor 22 and may be combined with MR images to produce hybrid structural and metabolic or functional images. Conditioning circuits 72, coincidence processor 74 and sorter 76 may each be external of scanner 48 or system control 32, or may be integrated therein.

A blanking control or monitor 80 is also included in system control 32. Blanking monitor 80 identifies and records times during which MR components 50-56 are active or transmitting. Blanking monitor 80 may use this timing data to gate PET data acquisition by detector 70 or signal conditioning by front-end electronics 72, or may output a timing sequence to be applied during data processing by coincidence processor 74, sorter 76, processor 68, or image reconstructor 22. Blanking monitor 80 may therefore be connected to pulse generator 57, RF transmit/receive module 38, gradient amplifiers 42, and/or other system components to synchronously monitor acquisition sequence instructions or may be connected directly to gradient coils 50 and/or RF coils 56, 58 to monitor or detect active times thereof. In other words, blanking monitor 80 may exclude PET data from a PET acquisition sequence by monitoring/detecting MR transmissions and then reactively generating the timing sequence or blanking signal or may exclude PET data by generating the timing sequence or blanking signal synchronously with the MR transmissions. It is also appreciated that blanking monitor 80 may individually include a gradient pulse monitor, an RF pulse monitor, or other MR transmission monitors, or may operate to monitor all or any combination of MR transmissions.

Figure 2:
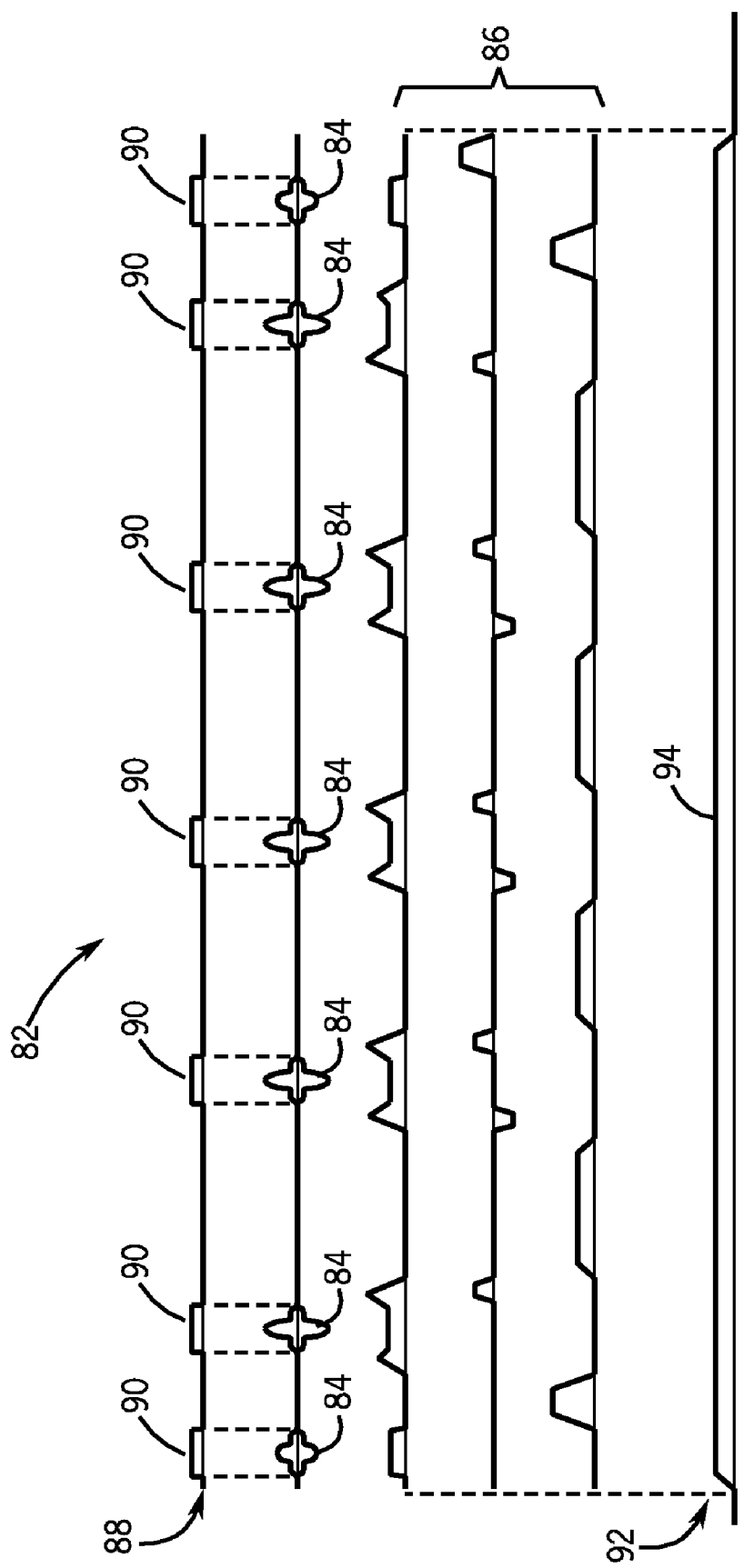
FIG. 2 is a graph of an exemplary MR scan sequence with PET gating in accordance with an embodiment of the present invention.

Referring now to FIG. 2, a graph of an exemplary MR scan sequence 82 to be carried out by a combined PET-MR scanner is depicted. A number of RF excitation pulses 84 are transmitted, during which time a series of spatial-encoding, dephasing, and/or rephasing gradient pulses 86 may be applied, to carry out any known MR acquisition sequence. An RF pulse monitoring sequence is shown along line 88. A blanking signal generated synchronously with the RF waveform or an RF pulse monitor determines and records the active transmission times 90 of the RF coils of the MR portion of the scanner over the course of the scan sequence 82. Similarly, a gradient pulse monitoring sequence is shown along line 92. Thus, at all times when any gradient pulse or other magnetic field is being applied 86, a blanking signal generated synchronously with the gradient waveforms or a gradient pulse monitor records the timing 94 of such transmissions over the course of the scan sequence 82. As shown, RF pulse timing sequence 88 shows an interstitial monitoring pattern, while gradient pulse timing sequence 92 is a continuous monitoring pattern, since one or more gradients were applied at all times during the portions of the MR scan sequence shown 82. It is understood, however, that the number, period, length, and other characteristics of the RF and gradient sequences 84, 86 shown may vary according to any known acquisition sequence and that each corresponding blanking signal 88, 92 may be continuous or interstitial. These timing sequences 88, 92 may be used individually or in combination to gate data acquisition or otherwise exclude compromised PET data from subsequent image reconstruction.

Figure 3:
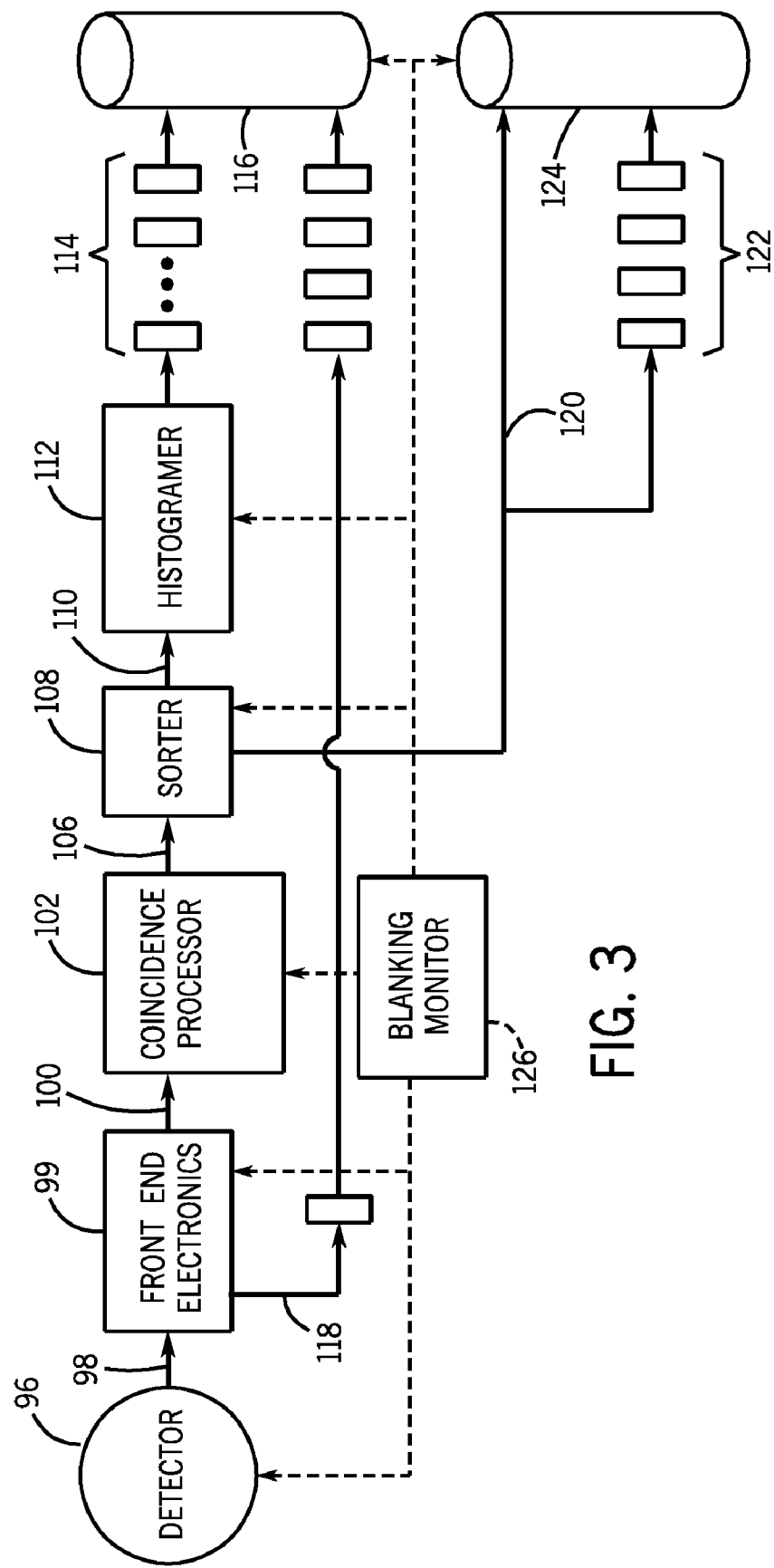
FIG. 3 is a block diagram of a PET imaging system in accordance with an embodiment of the present invention.

FIG. 3 is a block diagram of a PET acquisition system in accordance with an embodiment of the present invention. A detector 96, as described above, transforms incidences of gamma rays upon the scintillators thereof into electrical signals 98. In certain embodiments of the present invention, the output of detector 96 may be governed or gated by a blanking circuit or other acquisition controller 126 such that no PET signals 98 are output during active MR transmission times— either RF pulse transmissions or gradient pulse applications. As mentioned above, blanking controller 126 may detect MR transmissions or may be integrated with the pulse generator or other MR component to synchronously identify MR transmission times as the pulses are produced. The analog electrical signals 98 generated by detector 96 are then conditioned by front-end electronics 99 and converted to digital signals 100. The output of front-end electronics 99 may also be controlled by blanking monitor or controller 126, such that digital signals 100 are not produced during periods identified by blanking monitor 126. Digital signals 100 may also include timing information regarding when the signals were detected. Coincidence processor 102 reads the digital PET data 100 to determine coincidences of two generally opposite gamma rays. In this regard, the blanking circuit or controller 126 can input a timing sequence of active MR transmissions to the coincidence processor 102 (as an alternative to, or in combination with, the gating of detector 96 and front-end electronics 99). Thus, coincidence processor 102 can be controlled to only process PET data corresponding to acquisition times at which no active MR transmissions were occurring. In other words, coincidence processor 102 can be configured to process only the PET data uncompromised by MR transmissions and exclude compromised PET data.

Coincidence processor 102 outputs a stream of coincidence data 106 to be processed by data sorter 108. Sorter 108 is programmed to determine which of the gamma ray coincidences 106 should be further processed as true coincidence events 110. In other words, sorter 108 may filter out coincidence events which represent data outside the desired field of view, and may organize the data to be acquired into one of multiple data frames based on a dynamic, cardiac-gated or respiratory-gated imaging protocol. The coincidence events 110 can then be binned and integrated by a data processing unit (or histogramer) 112 to produce frames of PET data 114 to be stored as raw PET data arrays in a data storage unit 116 for subsequent image reconstruction. As with coincidence processor 102, sorter 108 and histogrammer 112 may be connected to receive MR transmission timing sequences from the blanking circuit or acquisition controller 126. Thus, sorter 108 and histogrammer 112 can be programmed to ignore coincidences or processed PET data which may be compromised by MR transmissions.

In other embodiments, frames of raw, unprocessed PET data 118 that include deadtime, single gamma ray detections, and potentially compromised data may be transmitted directly from the detector 98 or detector electronics 99 to be stored in data storage unit 116 for subsequent analysis. Likewise, unprocessed coincidence data 120, which may or may not include potentially compromised PET data, can be stored as frames 122 in a database 124 for subsequent analysis. The output of blanking monitor 126 may also be stored in one or both of data storage units 116, 124 for subsequent processing of PET data frames 118, 122.

Figure 4:
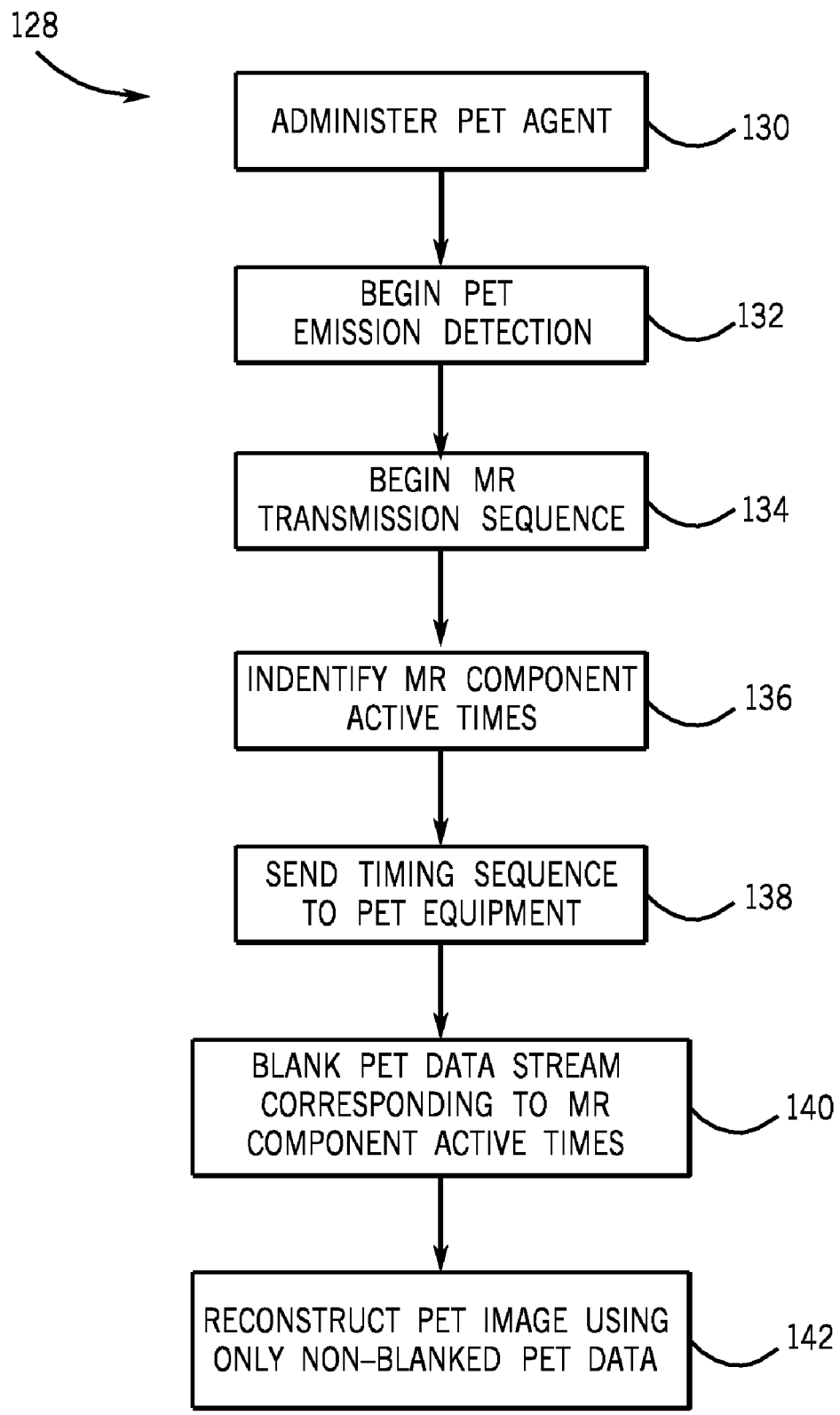
FIG. 4 is a flowchart representing a technique for simultaneous PET-MR acquisition in accordance with an embodiment of the present invention.

Referring now to FIG. 4, a flowchart illustrating an exemplary combined PET-MR acquisition technique 128 is shown. A positron-emitting PET agent labeled with radionuclides is administered to a patient or subject of interest at block 130. Positron emissions are then detected in the form of gamma rays produced by positron-electron annihilations occurring within the patient or subject at block 132. This stream of PET data is acquired and processed in a similar manner to that described with respect to FIG. 3. The technique 128 then includes the commencement of an MR acquisition sequence at block 134. MR acquisition at block 134 may include any of a variety of known MR sequences, including spin echo, gradient echo, and other forms of acquisition. In addition, it is appreciated that MR acquisition may begin prior to PET acquisition.

At block 136, a blanking signal generated synchronously with the MR sequence or through an acquisition controller monitoring the MR sequence is used to identify the particular times at which RF pulses, gradient pulses, or both are transmitted. The identified MR transmission times are sent as a timing or control sequence to the PET acquisition components at block 138 for exclusion of compromised MR data from the data stream used for PET image reconstruction. The stream of PET data traveling from the detector to the image reconstructor is then blanked at block 140 in accordance with the identified MR transmission times. As discussed above, this data exclusion may be achieved by disabling PET data generation (i.e. gating the detector ring or front end electronics) or by inserting markers to indicate as blanked segments of the PET data stream corresponding to potentially compromised data such that the segments are not processed for coincidences, coincidence events, binning, or image reconstruction in general. The technique concludes with reconstruction of PET images using only the non-excluded (uncompromised) PET data and reconstruction of MR images from the data acquired by the MR acquisition sequence at block 142.

Accordingly, in one embodiment of the present invention, a combined PET-MR imaging scanner includes a plurality of gradient coils positioned about a bore of a magnet to impress a polarizing field therein, an RF coil assembly connected to a pulse generator to emit an RF pulse sequence and arranged to receive resulting MR signals from a subject of interest in the bore, a detector positioned to detect PET emissions from the subject of interest, and a coincidence processor connected to receive output from the detector. The imaging scanner also includes a blanking control configured to identify periods during which PET detection may be compromised.

In accordance with another embodiment of the invention, an image acquisition controller includes an MR transmission monitor configured to output signals indicative of MR transmissions and connected to a processing unit. The processing unit is programmed to receive the signals from the MR transmission monitor, generate a timing sequence identifying MR transmission times from the signals, and exclude PET data from a PET imaging process according to the timing sequence.

The present invention also includes a method for PET imaging. The method includes the administration of a PET agent to a subject of interest and detection of positron emissions from the subject of interest to generate a stream of PET data. MR-compromised data is excluded from the PET data stream and PET images are then reconstructed from the PET data stream.

The present invention has been described in terms of the preferred embodiment, and it is recognized that equivalents, alternatives, and modifications, aside from those expressly stated, are possible and within the scope of the appending claims. The order and sequence of process or method steps may be varied or re-sequenced according to alternative embodiments.

What is claimed is:

1. An imaging scanner comprising:
   a plurality of gradient coils positioned about a bore of a magnet to impress a polarizing field therein;
   an RF coil assembly coupled to a pulse generator to emit an RF pulse sequence and arranged to receive resulting MR signals from a subject of interest in the bore;
   a detector positioned to detect PET emissions from the subject of interest;
   a coincidence processor configured to receive an output from the detector; and
   a blanking control configured to identify periods during which PET detection may be compromised.

2. The imaging scanner of claim 1 wherein the blanking control comprises at least one of a blanking circuit and a blanking signal and is configured to identify periods during which at least one of the plurality of gradient coils and the RF coil assembly is transmitting.

3. The imaging scanner of claim 1 further comprising a disabling circuit adapted to disable the coincidence processor during the periods identified by the blanking control.

4. The imaging scanner of claim 1 further comprising a coincidence data sorter coupled to the coincidence processor and programmed to process only data uncorrupted by transmissions of the plurality of gradient coils and the RF coil assembly.

5. The imaging scanner of claim 1 wherein the detector is a PET detector ring and is configured to output PET data only during periods not identified by the blanking control.

6. The imaging scanner of claim 5 further comprising a shielding assembly constructed to reduce magnetic field and RF pulse effects on the PET detector ring.

7. The imaging scanner of claim 1 further comprising a tomographic reconstruction unit configured to receive PET data via the detector and coincidence processor, and reconstruct a PET image based on at least the PET data.

8. The imaging scanner of claim 7 wherein the tomographic reconstruction unit is further configured to receive identifications from the blanking control and programmed to reconstruct the PET image only from PET data not occurring during MR transmissions.

9. An image acquisition controller comprising:
   an MR transmission monitor configured to output signals indicative of MR transmissions; and
   a processing unit programmed to:
      receive the signals from the MR transmission monitor;
      generate a timing sequence identifying MR transmission times based on the signals; and
      exclude data from a PET image reconstruction according to the timing sequence.

10. The image acquisition controller of claim 9 wherein the MR transmission monitor is further configured to detect the MR transmissions and then output signals indicative of the MR transmissions.

11. The image acquisition controller of claim 9 wherein the MR transmission monitor is further configured to output the signals indicative of the MR transmissions synchronously with the MR transmissions.

12. The image acquisition controller of claim 9 wherein the processing unit is further programmed to insert markers representing the timing sequence into a PET data stream.

13. The image acquisition controller of claim 12 further comprising an image reconstruction unit configured to reconstruct an image from data of the PET data stream outside the markers.

14. The image acquisition controller of claim 9 wherein the processing unit is further programmed to send disable signals corresponding to the timing sequence for at least one of a scintillator array, a photo-detector array, front-end electronics, and a coincidence processor.

15. The image acquisition controller of claim 9 further comprising a coincidence sorter coupled to the processing unit and configured to bin only PET coincidence data not detected during the MR transmission times.

16. The image acquisition controller of claim 9 wherein the MR transmission monitor comprises at least one of an RF pulse detector configured to output signals indicative of RF pulse transmissions to the processing unit, a gradient pulse detector configured to output signals indicative of gradient pulse transmissions to the processing unit, and a pulse generator configured to output signals indicative of pulse transmissions synchronously with pulse generation signals.

17. The image acquisition controller of claim 16 wherein the processing unit is further programmed to generate the timing sequence to identify both gradient pulse transmission times and RF pulse transmission times.

18. A method for PET imaging comprising:
   administering a PET agent to a subject of interest;
   detecting positron emissions from the subject of interest to generate a stream of PET data;
   excluding MR-compromised PET data from the stream of PET data; and
   reconstructing PET images from the stream of PET data.

19. The method of claim 18 further comprising monitoring transmission times of MR components of a hybrid PET-MR system during positron emission detection.

20. The method of claim 19 wherein the MR-compromised PET data corresponds to positron emissions detected during the transmission times of the MR components.

21. The method of claim 18 further comprising marking segments of the stream of PET data as blanked and reconstructing the PET images from non-blanked PET data from the stream of PET data.

22. The method of claim 18 wherein excluding MR-compromised PET data from stream of PET data includes disabling at least one of positron emission detection, PET data stream generation, coincidence processing, and coincidence event integration during application of an MR magnetic field.

23. The method of claim 18 further comprising storing MR-compromised PET data and non-compromised PET data for subsequent processing.

24. The method of claim 18 further comprising acquiring MR data from the subject of interest during positron emission detection and reconstructing MR images therefrom.

* * * * *